US010982064B2

(12) United States Patent
Priolo et al.

(10) Patent No.: US 10,982,064 B2
(45) Date of Patent: Apr. 20, 2021

(54) MULTILAYER BARRIER FILMS

(71) Applicant: 3M INNOVATIVE PROPERTIES COMPANY, St. Paul, MN (US)

(72) Inventors: Morgan A. Priolo, Woodbury, MN (US); Joseph M. Pieper, Atlanta, GA (US); Ellison G. Kawakami, St. Paul, MN (US); Henrik B. Van Lengerich, St. Paul, MN (US); Christopher S. Lyons, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 16 days.

(21) Appl. No.: 16/086,493

(22) PCT Filed: Mar. 22, 2017

(86) PCT No.: PCT/US2017/023597
§ 371 (c)(1),
(2) Date: Sep. 19, 2018

(87) PCT Pub. No.: WO2017/165522
PCT Pub. Date: Sep. 28, 2017

(65) Prior Publication Data
US 2019/0055370 A1 Feb. 21, 2019

Related U.S. Application Data

(60) Provisional application No. 62/313,303, filed on Mar. 25, 2016.

(51) Int. Cl.
*H01L 51/52* (2006.01)
*C08J 7/04* (2020.01)
*H01L 51/50* (2006.01)

(52) U.S. Cl.
CPC ........ *C08J 7/0423* (2020.01); *H01L 51/5253* (2013.01); *H01L 51/5256* (2013.01);
(Continued)

(58) Field of Classification Search
CPC .. C08J 7/0423; C08J 2367/02; C08J 2433/02; C08J 2479/02; H01L 51/5253; H01L 51/5256; H01L 51/502
See application file for complete search history.

(56) References Cited

U.S. PATENT DOCUMENTS 4,696,719 A 9/1987 Bischoff
4,722,515 A 2/1988 Ham
(Continued)

FOREIGN PATENT DOCUMENTS

WO WO 2012-106184 8/2012
WO WO 2014-025348 2/2014
(Continued)

OTHER PUBLICATIONS

Affinito, "Polymer-Oxide Transparent Barrier Layers", Society of Vacuum Coaters, 39th Annual Technical Conference Proceedings, 1996, pp. 392-397.
(Continued)

*Primary Examiner* — Hoa B Trinh
(74) *Attorney, Agent, or Firm* — Lisa P. Fulton (57) ABSTRACT

A barrier film. The barrier film may include a substrate, an inorganic layer disposed on a side of the substrate, and an organic layer-by-layer structure disposed on a side of the inorganic layer, where in the organic layer-by-layer structure comprises a layer of a cationic polyelectrolyte and a layer of an anionic polyelectrolyte.

11 Claims, 4 Drawing Sheets

(52) U.S. Cl.
CPC ........ *C08J 2367/02* (2013.01); *C08J 2433/02* (2013.01); *C08J 2479/02* (2013.01); *H01L 51/502* (2013.01)

(56) References Cited

U.S. PATENT DOCUMENTS

| | | | |
|---|---|---|---|
| 4,842,893 | A | 6/1989 | Yializis |
| 4,954,371 | A | 9/1990 | Yializis |
| 5,018,048 | A | 5/1991 | Shaw |
| 5,032,461 | A | 7/1991 | Shaw |
| 5,097,800 | A | 3/1992 | Shaw |
| 5,125,138 | A | 6/1992 | Shaw |
| 5,440,446 | A | 8/1995 | Shaw |
| 5,547,908 | A | 8/1996 | Furuzawa |
| 5,725,909 | A | 3/1998 | Shaw |
| 5,888,594 | A | 3/1999 | David |
| 6,045,864 | A | 4/2000 | Lyons |
| 6,214,422 | B1 | 4/2001 | Yializis |
| 6,231,939 | B1 | 5/2001 | Shaw |
| 7,018,713 | B2 | 3/2006 | Padiyath |
| 7,186,465 | B2 | 3/2007 | Bright |
| 7,276,291 | B2 | 10/2007 | Bright |
| 8,234,998 | B2 | 8/2012 | Krogman |
| 8,241,752 | B2 | 8/2012 | Bright |
| 8,999,497 | B2 | 4/2015 | Nagayama |
| 9,608,225 | B2 * | 3/2017 | Kim .................. H01L 27/3209 |
| 2004/0053037 | A1 | 3/2004 | Koch |
| 2011/0100454 | A1 | 5/2011 | Adam |
| 2011/0175064 | A1 * | 7/2011 | Kim .................. H01L 51/5036 257/40 |
| 2011/0223434 | A1 | 9/2011 | Roehrig |
| 2012/0003484 | A1 | 1/2012 | Roehrig |
| 2012/0148813 | A1 * | 6/2012 | Angelopoulos ........ B82Y 30/00 428/216 |
| 2012/0208033 | A1 | 8/2012 | Weigel |
| 2013/0302627 | A1 | 11/2013 | Roehrig |
| 2013/0323519 | A1 | 12/2013 | Klun |
| 2015/0086734 | A1 * | 3/2015 | Pietsch .................. C08J 7/0427 428/36.6 |
| 2016/0030977 | A1 | 2/2016 | Grunlan |
| 2016/0088756 | A1 | 3/2016 | Ramadas |
| 2016/0164031 | A1 | 6/2016 | Pieper |

FOREIGN PATENT DOCUMENTS

| | | |
|---|---|---|
| WO | WO 2014-025387 | 2/2014 |
| WO | WO 2014-025570 | 2/2014 |
| WO | WO 2014-025983 | 2/2014 |
| WO | WO 2014-113562 | 7/2014 |
| WO | WO 2015-013225 | 1/2015 |

OTHER PUBLICATIONS

Affinito, "Vacuum Deposited Polymer/Metal Multilayer Films for Optical Application", Thin Solid Films,1995, vol. 270, pp. 43-48.
Jang "Layer-by-Layer Assembly of Thin Film Oxygen Barrier", Thin Solid Films, 2008, vol. 516, pp. 4819-4825.
Krogman, "Automated Process for Improved Uniformity and Versatility of Layer-by-Layer Deposition", Langmuir, 2007, vol. 23, pp. 3137-3141.
Priolo, "Super Gas Barrier of Transparent Polymer-Clay Multilayer Ultrathin Films", Nano Letters, Dec. 2010, vol. 10, No. 12, pp. 4970-4974.
Shaw, "A New High-Speed Process for Vapor Depositing Acrylate Thin Films: An Update", Society of Vacuum Coaters, 36$^{th}$ Annual Technical Conference Proceedings,1993, pp. 348-351.
Shaw, "A New Vapor Deposition Process for Coating Paper and Polymer Webs", 6$^{th}$ International Vacuum Coating Conference,1992, pp. 18-24.
Shaw, "Use of Evaporated Acrylate Coatings to Smooth the Surface of Polyester and Polypropylene Film Substrates", North America UV/EB Conference Proceedings, vol. II, RadTech,1996, pp. 701-707.
Shaw, "Use of Vapor Deposited Acrylate Coatings to Improve the Barrier Properties of Metallized Film", Society of Vacuum Coaters, 37$^{th}$ Annual Technical Conference Proceedings, 1994, pp. 240-247.
Yang, "Super Gas Barrier of All-Polymer Multilayer Thin Films", Macromolecules, Feb. 2011, vol. 44, pp. 1450-1459.
Yoshida, "Organic Light Emitting Devices on Polymer Substrates", Journal of Photopolymer Science and Technology, Jan. 2001, vol. 14, No. 2, pp. 327-332.
Zhou, "Covalent Linking of Quantum Dots to Polymer for Inorganic-Inorganic Luminescence Films via Layer-by-Layer Assembly with Clay", Chemical Communications, 2014, vol. 50, pp. 11370-11373.
3M News Center, "3M Announces Commercial Availability of 3M™ FTB3 Barrier Film", Published on 3M News on May 22, 2012, Retrieved from internet on Nov. 19, 2018, URL: <http://news.3m.com/press-release/company/3m-announces-commercial-availability-3m-ftb3-barrier-film>, 2 pages.
International Search Report for PCT International Application No. PCT/US2017/023597, dated Jun. 20, 2017, 5 pages.

* cited by examiner

MULTILAYER BARRIER FILMS

BACKGROUND

Certain materials useful in the preparation of luminescent devices, such as organic light emitting diodes (OLED) and quantum dots, undergo oxidative damage when exposed to air and moisture, often resulting in a loss of luminescence. While the preparation of barrier layers effective against the penetration of air and moisture are known, pinhole defects within e.g. inorganic oxide layers of the barrier can result in the development of "dark spot" defects within polymeric matrices incorporating the sensitive material.

SUMMARY

The present disclosure relates to forming a barrier film with a high moisture and oxygen resistance. Such articles are particularly useful in the preparation of a device, in particular a luminescent device, and a method is described for assembly of the luminescent device. The moisture sensitive luminescent material can be, for example, a quantum dot material disposed within a matrix, or a film construction that includes an OLED structure. The present disclosure describes how the barrier properties of an inorganic oxide layer can be effectively buttressed by a structure built up with layer-by-layer deposition.

In a first aspect, a barrier film is provided. The barrier film may include a substrate, an inorganic layer disposed on a side of the substrate, and an organic layer-by-layer structure disposed on a side of the inorganic layer, wherein the organic layer-by-layer structure comprises a layer of a cationic polyelectrolyte and a layer of an anionic polyelectrolyte.

In another aspect, a device is provided. The device may include the barrier film of the present disclosure and a luminescent layer.

In another aspect, a method is provided. The method may include (a) depositing a layer of inorganic material on a substrate, (b) depositing a layer of cationic polyelectrolyte onto the layer of inorganic material from an aqueous solution; (c) rinsing and/or drying the layer of cationic polyelectrolyte; (d) depositing a layer of anionic polyelectrolyte onto the layer of cationic polyelectrolyte from an aqueous solution; (e) rinsing and/or drying the layer of anionic polyelectrolyte; and (0 repeating the steps of (b)-(e) until a layer-by-layer structure of alternating cationic polyelectrolyte and anionic polyelectrolyte layers is formed.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure provides for the construction of a barrier film, the construction of a device, in particular a luminescent device, and a method for making the barrier film. The luminescent device includes at least one barrier film including layers built up using layer-by-layer deposition. The oxygen and moisture sensitive luminescent material can be, for example, a quantum dot material disposed in a film, or a film construction that includes an OLED structure. In one particular embodiment, the luminescent device includes a high optical transmission barrier film, high barrier properties of the matrix containing the quantum dots, and high adhesion of the matrix to the barrier film for durability during converting and product use. In one particular embodiment, the barrier films produced can be useful for bonding to other materials, such as polymeric hot-melt materials, pressure sensitive adhesives, hard coats, and the like.

Certain terms are used throughout the description and the claims that, while for the most part are well known, may require some explanation. It should be understood that, as used herein:

The term "(meth)acrylate" with respect to a monomer means a vinyl-functional alkyl ester formed as the reaction product of an alcohol with an acrylic or a methacrylic acid, for example, acrylic acid or methacrylic acid.

The term "(co)polymer" means a homopolymer or a copolymer.

The term "homogeneous" means exhibiting only a single phase of matter when observed at a macroscopic scale.

The term "layer by layer deposition" means a thin film fabrication technique wherein the films are formed by depositing alternating layers of oppositely charged materials with wash steps in between. This can be accomplished by using various techniques such as immersion, spin, spray, electromagnetism, or fluidics.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

Current liquid crystal displays (LCDs) may present only 50% of the NTSC Color Space standard. OLED displays, a competing technology, may present greater than 100% of the NTSC Color Space standard. The use of quantum dot emitting film (QDEF) allows LCD manufacturers to increase the color gamut with their current technology platform, without significant changes to their supply chain or technology platform. In some cases, QDEF can be used for increasing the color gamut of LCDs across a wide range of applications including television, monitor, notebook, and handheld devices. A full-UV-cured QDEF system that includes increased throughput speed is desired. In some cases, certain quantum dot chemistries can be incompatible with a traditional thermally-cured epoxy-amine polymer matrix, thereby limiting the types of quantum dots that can be used for QDEF constructions.

Quantum dot films and elements are utilized in display and other optical constructions. The quantum dots need to be sealed from oxygen and moisture, and are typically dispersed in a polymer matrix, which can then be sealed between flexible transparent barrier films. The polymer matrix can be a hot melt matrix, a thermally cured matrix such as epoxy, a hybrid matrix such as a radiation curable (meth)acrylate blended with an epoxy amine that undergoes radiation cure of the (meth)acrylate to stabilize the matrix during subsequent thermal cure, or the polymer matrix can be a radiation curable (meth)acrylate material such that a subsequent thermal cure is not necessary.

The continuous roll-to-roll manufacture of flexible transparent barrier films has been developed for oxygen- and moisture-sensitive applications requiring high optical transmission. Examples of such roll-to-roll manufacturing methods and the barrier films produced by these methods can be found, for example, in U.S. Pat. No. 5,440,446 (Shaw et al.) entitled ACRYLATE COATING MATERIAL; U.S. Pat. No. 5,725,909 (Shaw et al.) entitled ACRYLATE COMPOSITE BARRIER COATING PROCESS; U.S. Pat. No. 6,231,939 (Shaw et al.) entitled ACRYLATE COMPOSITE BARRIER COATING; and U.S. Pat. No. 7,018,713 (Padiyath et al.) entitled FLEXIBLE HIGH-TEMPERATURE ULTRABARRIER; and also in U.S. Patent Publication Nos. 2011/0223434 (Roehrig et al.) entitled GRADIENT COMPOSITION BARRIER; and 2012/0003484 (Roehrig et al.) entitled MOISTURE RESISTANT COATING FOR BARRIER FILMS; and in U.S. Patent Application No. 61/754,786 (Nelson et al.) entitled QUANTUM DOT FILM; and also in U.S. patent application Ser. No. 14/907,276 (Pieper et al.) entitled ADHESIVE BARRIER FILM CONSTRUCTION.

Known methods of barrier film production typically are conducted in a near-vacuum environment, and use a high Tg polymeric substrate onto which a first radiation curable resin is applied as a smoothing layer, this first layer can be cured using, for example, UV or electron beam radiation. Next, an inorganic oxide barrier layer is coated (for example by sputtering) onto the surface of the smoothing layer, and a second radiation curable resin is applied as protective layer, which is then cured again using similar techniques. Each of the pairs of inorganic oxide barrier layer/protective layer are often referred to as "dyads", and any desired multiple of the dyads can be applied on top of one another to improve the barrier properties of the barrier film. Often, the inorganic oxide barrier layer has pinholes, through which gases can pass. These pinholes could create a focused path for gas transport that can create a region of catastrophic damage to sensitive materials beneath the barrier layer. This damage can be visualized as dark spots, known as freckle defects. The present application provides a structure built up from one or more iterations of layer-by-layer deposition and provides much better resistance to the passage of oxygen and water vapor.

Figure 1:
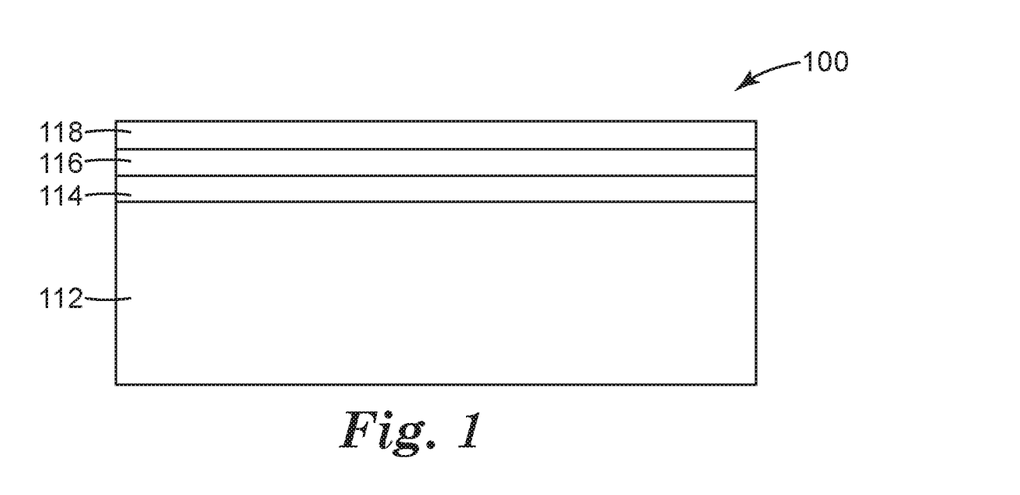
FIG. 1 shows a cross-sectional schematic view of a barrier film.

FIG. 1 shows a cross-sectional schematic view of a barrier film 100, according to one aspect of the disclosure. The barrier film 100 includes a substrate 112, an inorganic layer 116 disposed on a side of the substrate 112, and an organic layer-by-layer structure 118 disposed on the inorganic layer 116. An optional polymeric smoothing layer 114 can be disposed between substrate 112 and inorganic layer 116.

The substrate 112 can be selected from polymers such as polyethylene terephthalate (PET), heat-stabilized polyethylene terephthalate (HSPET), polyethylene naphthalate (PEN), polymethyl methacrylate (PMMA), styrene/acrylonitrile (SAN), styrene/maleic anhydride (SMA), polyoxymethylene (POM), polyvinylnaphthalene (PVN), polyetheretherketone (PEEK), polyaryletherketone (PAEK), high Tg fluoropolymers (e.g., DYNEON™ HTE terpolymer of hexafluoropropylene, tetrafluoroethylene, and ethylene), polycarbonate (PC), poly α-methyl styrene, polyarylate (PAR), polysulfone (PSul), polyphenylene oxide (PPO), polyetherimide (PEI), polyarylsulfone (PAS), poly ether sulfone (PES), polyamideimide (PAI), polyimide, polyphthalamide, cyclic olefin polymers (COP), cyclic olefin copolymers (COC), and triacetate cellulose (TAC). The substrate 112 can be a polymeric film, selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers. For applications where material costs are important, substrates made of PET, HSPET and PEN are especially preferred. Preferably the substrate has a thickness of about 0.01 to about 1 mm, more preferably about 0.05 to about 0.25 mm. In one particular embodiment, the substrates are PET.

Polymeric smoothing layers 114 can be selected from polymers including urethane acrylates (e.g., CN-968 and CN-983, both commercially available from Sartomer Co.), isobornyl acrylate (e.g., SR-506, commercially available from Sartomer Co.), dipentaerythritol pentaacrylates (e.g., SR-399, commercially available from Sartomer Co.), epoxy acrylates blended with styrene (e.g., CN-120580, commercially available from Sartomer Co.), di-trimethylolpropane tetraacrylates (e.g., SR-355, commercially available from Sartomer Co.), diethylene glycol diacrylates (e.g., SR-230, commercially available from Sartomer Co.), 1,3-butylene glycol diacrylate (e.g., SR-212, commercially available from Sartomer Co.), pentaacrylate esters (e.g., SR-9041, commercially available from Sartomer Co.), pentaerythritol tetraacrylates (e.g., SR-295, commercially available from Sartomer Co.), pentaerythritol triacrylates (e.g., SR-444, commercially available from Sartomer Co.), ethoxylated (3) trimethylolpropane triacrylates (e.g., SR-454, commercially available from Sartomer Co.), ethoxylated (3) trimethylolpropane triacrylates (e.g., SR-454HP, commercially available from Sartomer Co.), alkoxylated trifunctional acrylate esters (e.g., SR-9008, commercially available from Sartomer Co.), dipropylene glycol diacrylates (e.g., SR-508, commercially available from Sartomer Co.), neopentyl glycol diacrylates (e.g., SR-247, commercially available from Sartomer Co.), ethoxylated (4) bisphenol a dimethacrylates (e.g., CD-450, commercially available from Sartomer Co.), cyclohexane dimethanol diacrylate esters (e.g., CD-406, commercially available from Sartomer Co.), cyclic diacrylates such as, for example, tricyclodecane dimethanol diacrylates (e.g., SR-833S, commercially available from Sartomer Co.), isobornyl methacrylate (e.g., SR-423, commercially available from Sartomer Co.), and tris (2-hydroxy ethyl) isocyanurate triacrylate (e.g., SR-368, commercially available from Sartomer Co.), acrylates of the foregoing methacrylates and methacrylates of the foregoing acrylates.

Polymeric smoothing layer 114 can be formed by applying a layer of a monomer or oligomer to the substrate 112, and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The polymeric smoothing layer 114 can also be formed by applying a layer containing an oligomer or polymer in solvent and drying the thus-applied layer to remove the solvent. Plasma polymerization may also be employed. Most preferably, the polymeric smoothing layer 114 is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis), U.S. Pat. No. 7,186,465 (Bright et al.), U.S. Pat. No. 7,276,291 (Bright et al.), U.S. Pat. No. 8,241,752 (Bright et al.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of the polymeric smoothing layer 114 and its adhesion to the underlying substrate preferably is enhanced by appropriate pretreatment. A preferred pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the polymeric smoothing layer 114 will depend in part on the nature and surface topography of the substrate 112. The thickness preferably is sufficient to provide a smooth, defect-free surface to which the subsequent first inorganic barrier layer can be applied. For example, polymeric smoothing layer may have a thickness of a few nm (e.g., 2 or 3 nm) to about 5 micrometers, and can be thicker if desired.

The inorganic layers 116 can be referred to as the "inorganic barrier layer". Additional inorganic barrier layers and polymer layers can be present if desired. A variety of inorganic materials can be employed. In some embodiments, the inorganic layer can include a metal, a metallic compound, a composite material of a metal and an organic material, a composite material of a metallic compound and an organic material, or a combination thereof. Preferred inorganic materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. In some embodiments, the inorganic layer can include an inorganic material selected from at least one of aluminum oxide, silicon oxide, aluminum-silicon-oxide, aluminum-silicon-nitride, silicon-oxy-nitride, and aluminum-silicon-oxy-nitride, CuO, $TiO_2$, ITO, $Si_3N_4$, TiN, ZnO, aluminum zinc oxide, $ZrO_2$, yttria-stabilized zirconia and $Ca_2SiO_4$. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, plasma deposition, atomic layer deposition (ALD), plating and the like. Most preferably the inorganic barrier layers are formed using sputtering, e.g., reactive sputtering Enhanced barrier properties have been observed when the inorganic layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (e.g., plasma pretreatment) such as those described above with reference to the first polymer layer.

The desired chemical composition and thickness of inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm. In some embodiments, the inorganic layer may have pinholes.

Figure 2:
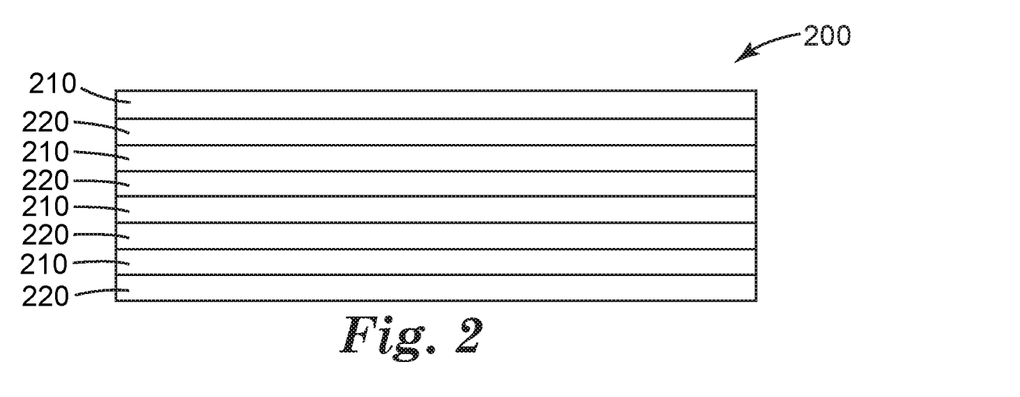
FIG. 2 shows a cross-sectional schematic view of a layer-by-layer structure.

The layer-by-layer structure 118 can include a layer of cationic polyelectrolyte and a layer of anionic polyelectrolyte. In some embodiments, the layer-by-layer structure 118 can includes cationic polyelectrolyte layers and anionic polyelectrolyte layers. FIG. 2 shows a cross-sectional schematic view of a layer-by-layer structure 200, according to one aspect of the disclosure. As shown in FIG. 2, the layer-by-layer structure 200 includes alternating cationic polyelectrolyte layer 210 and anionic polyelectrolyte layer 220. In some embodiments, the layer-by-layer structure can include bi-layer structure of a layer of a cationic polyelectrolyte and a layer of an anionic polyelectrolyte laid down in a layer-by-layer fashion. In other embodiments, the layer-by-layer structure can include more than one bi-layer structure of a layer of a cationic polyelectrolyte and a layer of an anionic polyelectrolyte laid down in a layer-by-layer fashion. In some embodiments, the organic layer-by-layer structure can be conformal to the inorganic layer.

Some cationic polyelectrolytes that are suitable in connection with the present disclosure include polyethylenimines (branched and/or linear), poly(allyl amine), poly (vinyl amine), cationic polyacrylamide, polymelamine, and copolymers thereof and polyvinylpyrrolidone and copolymers or derivatives thereof, and combinations thereof. More generally, a polycation layer can comprise polycationic molecules, polymers or nanoparticles.

Some anionic polyelectrolytes that are suitable in connection with the present disclosure include poly(acrylic acid), poly (methacrylic acid), poly (ethacrylic acid), poly (styrene sulfonic acid), poly (maleic acid), poly (vinyl phosphonic acid), and copolymers or derivatives thereof, and combinations thereof. More generally, a polyanion layer can comprise polyanionic molecules, polymers or nanoparticles.

In one particular embodiment, coupling agents, such as silane coupling agents, may optionally be added to the polymeric smoothing layer 114 of the barrier film 100, to improve adhesion within the barrier stack. Useful coupling agents are described, for example, in co-pending U.S. Patent Publication Nos. 2012/0208033 and 2012/003484, and also in U.S. Patent Application Ser. No. 61/437,850 entitled "Vapor-deposited Coating for Barrier Films and Methods of Making and Using the Same", filed Jan. 31, 2011); 61/680, 995 entitled "Composite Films Including a (Co)polymer Reaction Product of a Urethane (Multi)-(meth)acrylate (Multi)-silane", filed Aug. 8, 2012); 61/680,955 entitled "Barrier Film, Method of Making the Barrier Film, and Articles Including the Barrier Film", filed Aug. 8, 2012); and 61/680,963 entitled "Barrier Film Constructions and Methods of Making Same", filed Aug. 8, 2012). In some cases, cyclic azasilanes, such as N-n-butyl-aza-2,2-dimethoxysila-cyclopentane available from Gelest, Inc., Morrisville, Pa., have been found to be particularly useful, but other coupling agents known to those skilled in the art may also be used.

In some embodiments, the organic layer-by-layer structure can be conformal to the inorganic layer, thus sealing the pinholes of the inorganic layer. So, the barrier film of the present application can be substantially free of freckle defects, i.e., dark spots. In some embodiments, the barrier film is substantially free of nanoparticles or clay, thus reducing the manufacturing cost. The present application also provides a barrier film with much better resistance to the passage of oxygen and water vapor. In some embodiments, the inorganic layer has a water vapor transmission rate of less than 0.17 g/m²/day measured at 50° C. and 100% relative humidity and an oxygen transmission rate of less than 0.01 measured at 23° C. and 50% relative humidity. In some embodiments, the inorganic layer has a water vapor transmission rate of less than 0.07 g/m²/day measured at 50° C. and 100% relative humidity and an oxygen transmission rate of less than 0.01 measured at 23° C. and 50% relative humidity.

The process for making the barrier film of the present application can include the steps of (a) depositing a layer of inorganic material on a substrate; (b) depositing a layer of cationic polyelectrolyte onto the layer of inorganic material from an aqueous solution; (c) rinsing and/or drying the layer of cationic polyelectrolyte; (d) depositing a layer of anionic polyelectrolyte onto the layer of cationic polyelectrolyte from an aqueous solution; (e) rinsing and/or drying the layer of anionic polyelectrolyte; (f) repeating the steps of (b)-(e) until a layer-by-layer structure of alternating cationic polyelectrolyte and anionic polyelectrolyte layers is formed. The aqueous solutions of step (d) can be the same as, or different than the solutions used in step (b). The organic layer-bylayer structure may consist of different layers of polyelectrolyte and different layers of anionic polyelectrolyte. In one embodiment, a polar solvent other than water is used to deposit the organic material and to rinse the deposited layer. Prior to depositing a layer of cationic polyelectrolyte onto the layer of inorganic material, the substrate may be rinsed with methanol and then washed with water. Optionally, the substrate may be surface treated to improve the adhesion of the cationic polymer layer. The layer of inorganic material can be deposited by one or more methods selected from the group consisting of condensation, chemical vapor deposition, physical vapor deposition, evaporation, plasma deposition, reactive ion etching and sputtering.

Figure 3:
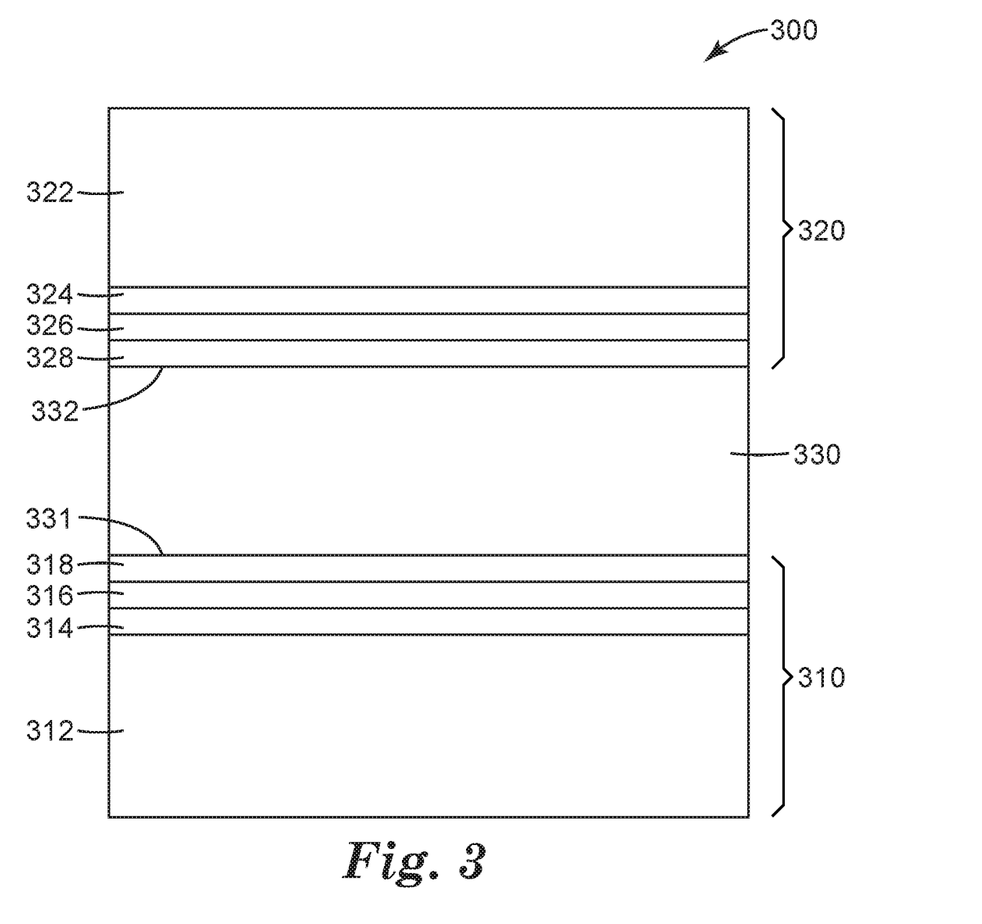
FIG. 3 shows a cross-sectional schematic view of a device.

FIG. 3 shows a cross-sectional schematic view of a luminescent device 300, according to one aspect of the disclosure. Luminescent device 300 includes a first barrier film 310, an optional second barrier film 320, and a luminescent layer 330 disposed between the first and optional second barrier films 310, 320. It is to be understood that in the description that follows, both first and second barrier films 110, 120 are included; however, in some cases only one barrier film may be used.

The first barrier film 310 includes a first substrate 312, a first polymeric smoothing layer 314 disposed on the first substrate 312, a first inorganic layer 316 disposed on the first polymeric smoothing layer 314, and a first layer-by-layer structure 318 disposed on the first inorganic layer 316. The optional second barrier film 320 includes a second substrate 322, a second polymeric smoothing layer 324 disposed on the second substrate 322, a second inorganic layer 326 disposed on the second polymeric smoothing layer 324, and a second layer-by-layer structure 328 disposed on the second inorganic layer 326.

The luminescent layer 330 is disposed between the first and second barrier films 310, 320, such that each of the first layer-by-layer structure 318 and the second layer-by-layer structure 328 are in contact with a first major surface 331 and an opposing second major surface 332, respectively, of the luminescent layer 330. The first inorganic layer 316 and the second inorganic layer 326 are resistant to the transmission of oxygen and water vapor. In some embodiments where even higher levels of barrier properties are wanted, a stack with more pairs of barrier layers and additional polymer layers (i.e., dyads) can be provided.

The luminescent layer 330 can be prepared by combining quantum dot material with a polymer matrix, and polymerizing and/or crosslinking the matrix, as known to one of skill in the art. The quantum dot material can include one or more populations of quantum dot material. Exemplary quantum dots or quantum dot material emit green light and red light upon down-conversion of blue primary light from the blue LED to secondary light emitted by the quantum dots. The respective portions of red, green, and blue light can be controlled to achieve a desired white point for the white light emitted by a display device incorporating the quantum dot film article. Exemplary quantum dots for use in quantum dot film articles described herein include CdSe with ZnS shells. Suitable quantum dots for use in quantum dot film articles described herein include core/shell luminescent nanocrystals including CdSe/ZnS, InP/ZnS, PbSe/PbS, CdSe/CdS, CdTe/CdS or CdTe/ZnS. In exemplary embodiments, the luminescent nanocrystals include an outer ligand coating and are dispersed in a polymeric matrix. Quantum dot and quantum dot material are commercially available from Nanosys Inc., Palo Alto, Calif. The quantum dot layer can have any useful amount of quantum dots. In many embodiments the quantum dot layer can have from 0.1 to 1% wt quantum dots.

In one or more embodiments the quantum dot material can include scattering beads or particles. These scattering beads or particles have a different refractive index than the refractive index of the epoxy polymer such as, by at least 0.05 or by at least 0.1. These scattering beads or particles can include polymers such as silicone, acrylic, nylon, etc. These scattering beads or particles can include inorganics such as $TiO_2$, $SiO_x$, $AlO_x$, etc. The inclusion of scattering particles can result in a longer optical path length and improved quantum dot absorption and efficiency. In many embodiments, the particle size is in a range from 1 to 10 micrometers, or from 2 to 6 micrometers. In many embodiments, the quantum dot material can include fillers such as fumed silica.

The polymer matrix in the luminescent layer 330 can be any suitable polymer that is compatible with the quantum dot material, and can be, for example, any of the (meth) acrylates described elsewhere for the first and second polymer smoothing layers 314, 324.

Figure 4:
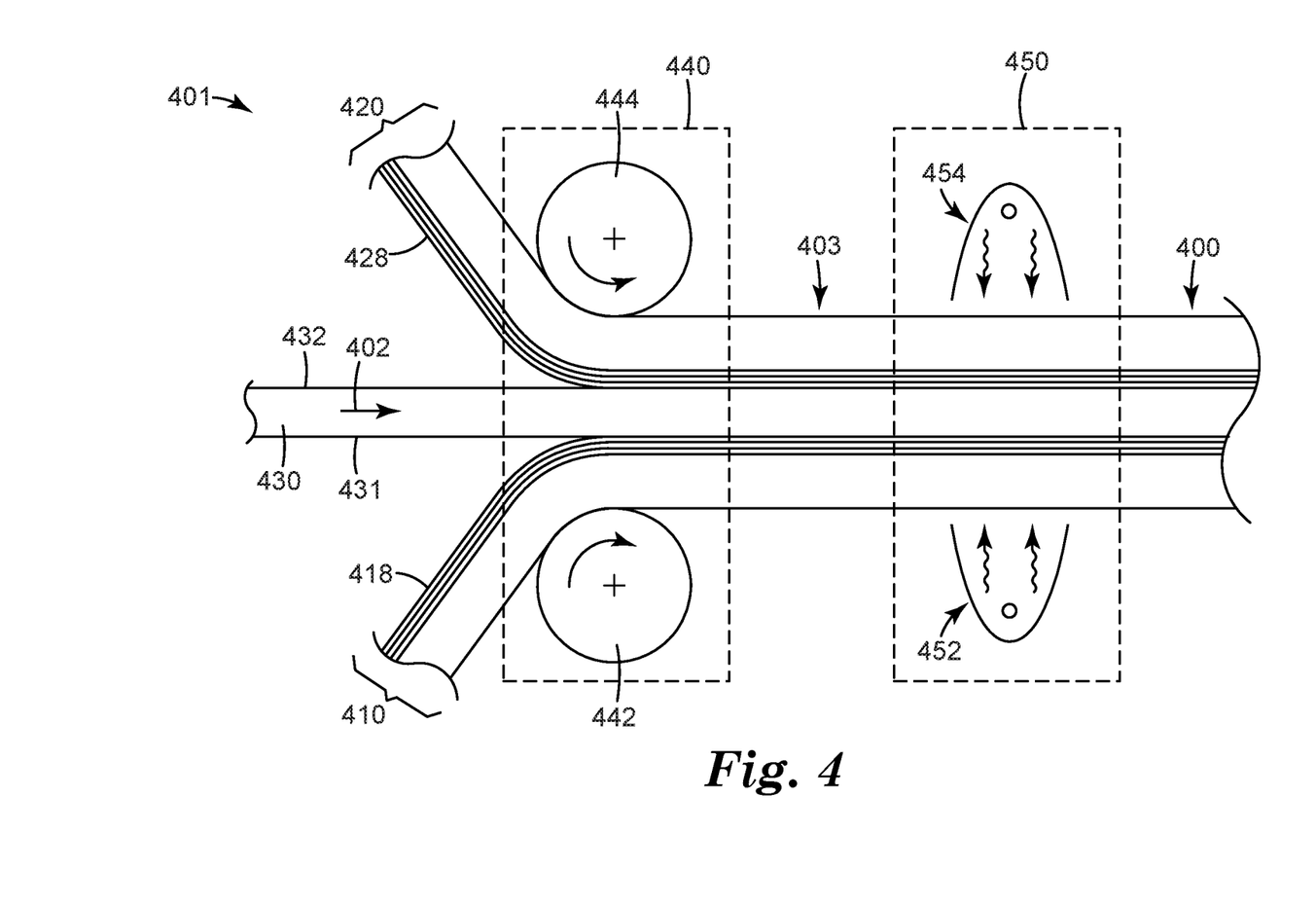
FIG. 4 shows a process for forming a device.

FIG. 4 shows a process 401 for forming a luminescent device 400, according to one aspect of the disclosure. Each of the elements 400-432 shown in FIG. 2 correspond to like-numbered elements 300-332 shown in FIG. 3, which have been described previously. A luminescent layer 430 can be unwound from a roll, extruded or coated from a die, or otherwise provided (technique of providing luminescent layer 430 is not shown), and travels in a direction 402 through a laminator 240 having opposing first and second lamination rollers 442, 444. A first and an optional second barrier film 410, 420 are also unwound from rolls (not shown), enter the laminator 440, and are pressed into contact with first and opposing second major surfaces 431, 432, respectively, of luminescent layer 430, forming an uncured laminate 403. Uncured laminate 403 passes through a curing apparatus 450 where one or more radiation sources 452, 454, preferably UV sources, irradiate the uncured laminate 403 to form the luminescent device 400.

Figure 5:
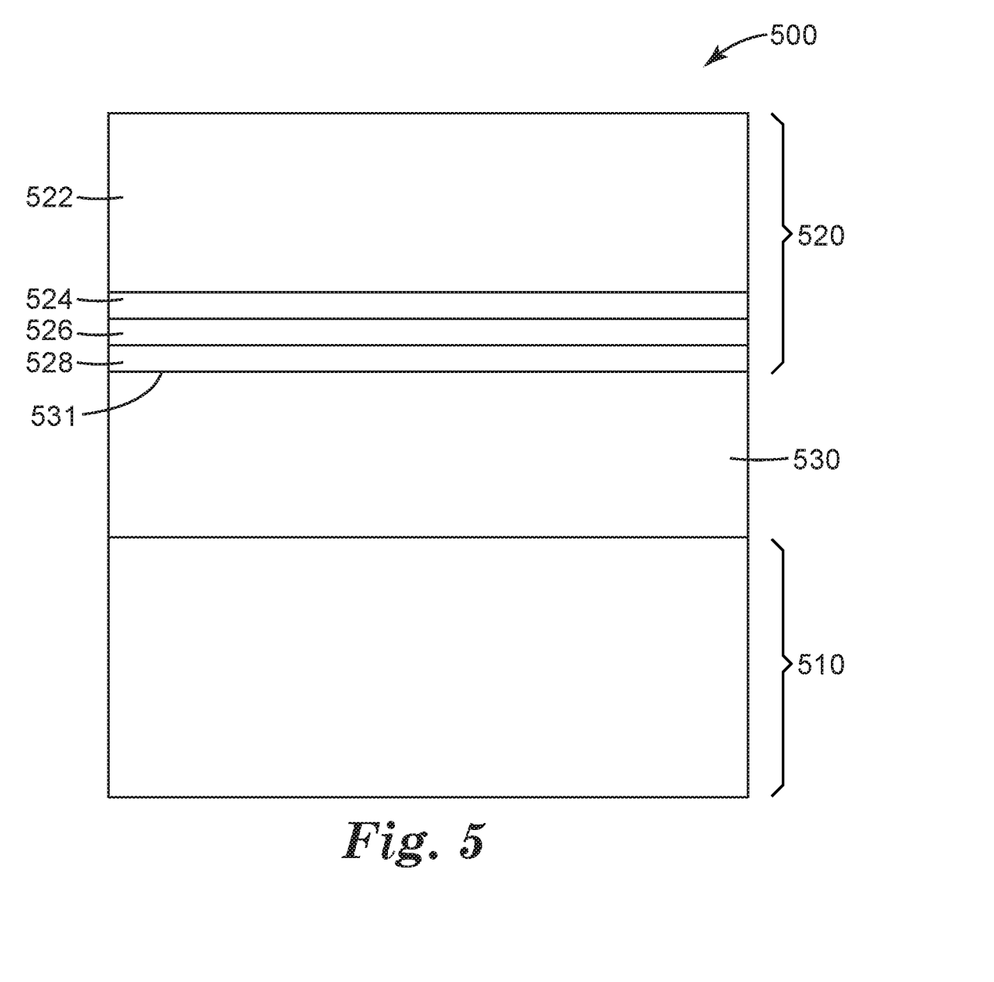
FIG. 5 shows a cross-sectional schematic view of a device according to one embodiment.

FIG. 5 shows a cross-sectional schematic view of a luminescent device 500, according to another aspect of the disclosure. Luminescent device 500 includes a device support 510, a barrier film 520, and a luminescent layer 530 disposed between the device support 510 and the barrier film 520.

The barrier film 520 includes a substrate 522, a polymeric smoothing layer 524 disposed on the substrate 522, an inorganic layer 526 disposed on the polymeric smoothing layer 524, and a layer-by-layer structure 528 disposed on the inorganic layer 526.

The device support 510 is any structure suitable for supporting the luminescent device. Examples of suitable device supports include rigid materials such as glass, silicon wafer, and sapphire. Other examples of suitable device supports include flexible materials like flexible glass, metal foils, and barrier films. The luminescent layer 530 is disposed between the device support 510 and barrier film 520, such that the layer-by-layer structure 528 is in contact with a major surface 531 of the luminescent layer 530. In some embodiments, the layer-by-layer structure is bonded to the luminescent layer by an adhesive layer (not shown). The inorganic layer 526 is resistant to the transmission of oxygen and water vapor. In some embodiments where even higher levels of barrier properties are wanted, a stack with more pairs of barrier layers and additional polymer layers (i.e., dyads) can be provided.

The luminescent layer 530 can be a single layer or multilayer luminescent structure. The luminescent materials of layer 530 include inorganic light emitting diodes (LED), organic light emitting diodes (OLED), or quantum dot material. In some embodiments, the luminescent layer includes a polymer matrix. In some embodiments, the luminescent layer includes additional layers such as transparent electrodes, electron transport layers, hole transport layers, light extraction layers, or antireflection layers.

The luminescent layer 530 can be prepared by any suitable technique known in the art, including vapor deposition (e.g. evaporation, sputtering, chemical vapor deposition, atomic layer deposition, or plasma deposition), liquid coating (e.g. printing, die coating, gravure coating, spin coating, dip coating, or spray coating), or lamination.

EXAMPLES

The following examples are intended to illustrate exemplary embodiments within the scope of this disclosure. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Test Methods
Water Vapor Transmission Rate

Some of the following Examples were tested for barrier properties on a water vapor transmission testing machine commercially available as PERMATRAN W700 from Mocon of Minneapolis, Minn. The testing regime was 50° C. and 100% RH.

Oxygen Transmission Rate

Some of the following Examples were tested for barrier properties on an oxygen transmission testing machine commercially available as OXTRAN 2/21 10× or OXTRAN 702 from Mocon of Minneapolis, Minn. The testing regimes were 23° C. and 0% RH, or 23° C. and 50% RH.

Sample Aging (65° C./95% RH Aging)

Some of the following Examples were thermally aged in an oven set at 65° C. and maintained at 95% RH for a given amount of time.

Sample Aging (85° C. Aging)

Some of the following Examples were thermally aged in an oven set at 85° C. for a given amount of time.

Materials

Unless otherwise noted, all parts, percentages, ratios, etc., in the examples and in the remainder of the specification are by weight. Unless otherwise noted, all chemicals were obtained from, or are available from, chemical suppliers such as Sigma-Aldrich Co. of St. Louis, Mo.

The following is a list of materials used throughout the Examples, as well as their brief descriptions and origins.

"PEI" refers to branched polyethylenimine, a positively charged polymer with molecular weight of approximately 25,000. It is received as ~100% solids, and in the Examples below was diluted to a 20% solution in water.

"PAA" refers to poly(acrylic acid), a negatively charged polymer with molecular weight of approximately 100,000, obtained as a 35% solution in water.

"VMT" refers to vermiculite clay, a negatively charged, two-dimensional particle, obtained as approximately 7.7% solids under trade name MICROLITE DISPERSION 963++ from Specialty Vermiculite Corp. of North Enoree, S.C.

Preparative Example 1 (Preparation of PEI, PAA, and VMT Coating Solutions for Layer-by-Layer (LBL) Assembly.)

A coating solution of PEI at a concentration of 0.1% was made by first adding 18.5 g of 20% PEI in water to a 4 L plastic jug. Deionized (DI) water was then added to a final mass of 3700 g and the solution was stirred with a magnetic stir bar for 30 minutes.

A coating solution of PAA at a concentration of 0.2% was made by first adding 21 g of 35% PAA in water to a 4 L plastic jug. DI water was then added to a final mass of 3675 g and the solution was stirred with a magnetic stir bar for 30 min. The appropriate amount (approximately 8 g) of IN NaOH was added to adjust the pH of the solution to 4.0±0.05.

A coating solution of VMT at a concentration of 1.0% was made by first adding 480.5 g of MICROLITE 963++ to a 4 L plastic jug. DI water was then added to a mass of 3700 g and the solution was stirred with a magnetic stir bar for 30 min.

Preparative Example 2 (General Method for Preparing Layer-by-Layer Coatings)

Layer-by-layer self-assembled coatings referred to below were made using a layer-by-layer coating apparatus commercially available from Svaya Nanotechnologies, Inc. of Sunnyvale, Calif. Additional information on layer-by-layer apparatus can be found in U.S. Pat. No. 8,234,998 (Krogman et al.) and in Krogman et al., "Automated Process for Improved Uniformity and Versatility of Layer-by-Layer Deposition," Langmuir, 23:3137-3141 (2007). In conjunction with this apparatus, spray nozzles with a flat spray pattern commercially available from Spraying Systems, Inc. of Wheaton, Ill. were employed to spray the coating solutions and rinse water at specified times, controlled by solenoid valves. The spray nozzles were connected with pressure vessels commercially available from Alloy Products Corp. of Waukesha, Wis. The vessels containing the coating solutions were pressurized with nitrogen to 30 psi (0.21 MPa), while the pressure vessel containing deionized water was pressurized with air to 30 psi (0.21 MPa). Substrates to be coated layer-by-layer were in the form of coupons 12 inches by 12 inches (30.5 cm by 30.5 cm), and were mounted on a vertical translation stage and held in place with a vacuum chuck. When carrying out a coating sequence, the polycation (e.g. PEI) solution was sprayed onto the substrate while the stage moved vertically (upward or downward) at 76 mm/sec. Next, after a dwell time of 4 seconds, the DI water solution was sprayed onto the substrate while the stage moved vertically at a speed of 102 mm/sec. Next, after a dwell time of 4 seconds, the polyanion (e.g. PAA, clay) solution was sprayed onto the substrate while the stage was moved vertically at 76 mm/sec. The DI water solution was sprayed onto the substrate while the stage moved vertically at 102 mm/sec. The above sequence was repeated to deposit a desired number of "bi-layers", wherein a bilayer refers to a pair of cationic and anionic layers deposited.

In some of the Examples below the layer-by-layer structures comprise a certain number of bilayers, referring to a pair of cationic and anionic layers deposited sequentially. In addition, in some embodiments the pairs are not identical to each other. For example, exchanging every other PAA layer for a VMT layer creates a "quadlayer" of PEI/PAA/PEI/VMT, which can be deposited similarly to the above general method.

The layer-by-layer structures were dried with compressed air or nitrogen following the entire coating process and oven dried at 70° C. for 15 minutes.

Preparative Example 3 (General Method for Preparing Sputtered Oxide Layers)

The sputtered oxide layers described herein were obtained by using a coating system described in U.S. Pat. No. 5,440,446 (Shaw, et al.) with the modification of reactive sputtering sources replacing the evaporation source.

Preparative Example 4 (General Method for Preparing Plasma Deposited Oxide Barrier Layers)

The plasma deposited oxide layers described herein were obtained by using a custom plasma treatment system described in detail in U.S. Pat. No. 5,888,594 (David, et al.)

Example 1

A substrate having a smoothing acrylate layer and an inorganic oxide layer, commercially available FTB3-50 Barrier Film from 3M Company of St. Paul, Minn. was provided with eight "quadlayers" of (PEI/PAA/PAA/VMT) applied onto the smoothing acrylate layer according to the protocol of Preparative Example 2. Then two sheets of these materials were laminated under inert atmosphere onto opposite sides of luminescent layer comprising a quantum-dot filled epoxy resin, with the respective layer-by layer structures in direct contact with the quantum-dot filled epoxy matrix as described above in connection with FIG. 3. After lamination, these films were cured under UV exposure and then heated at 100° C. for 10 minutes.

Comparative Example 1

A laminated structure similar to Example 1 was prepared, except that the layer-by-layer structures were not deposited on the FTB3-50 Barrier Film. Both Example 1 and Comparative Example 1 were aged at 85° C. for 500 hours. The Comparative Example 1 developed numerous dark "dark dot" defects compared to Example 1, which is substantially free of dark spots or has no dark spots.

Example 2

A barrier film was prepared by depositing a layer of silicon aluminum oxide directly onto a substrate of 0.002 inch (0.051 mm) thick PET film according to the procedure of Preparative Example 3. Then a layer-by-layer structure comprising 10.5 dyads of PEI/PAA (so that PEI was the innermost and outermost layer of the structure) was deposited according to the procedure of Preparative Example 2. Then two sheets of these materials were laminated under inert atmosphere onto opposite sides of a luminescent layer comprising a quantum-dot filled epoxy resin, with the respective layer-by layer structures in direct contact with the quantum-dot filled epoxy matrix as described above in connection with FIG. 2. After lamination, these films were cured under UV exposure and then heated at 100° C. for 10.

Comparative Example 2

A laminated structure similar to Example 2 was prepared, except that the layer-by-layer structures were not deposited on the inorganic oxide layer. Both Example 2 and Comparative Example 2 were aged at 65° C. and 95% RH for 500 hours. Comparative Example 2 had numerous dark dot" defects, whereas Example 2 had only one.

Example 3

A laminated structure similar to Example 2 was prepared, except that a smoothing acrylate layer was first applied to the substrate, and the inorganic oxide layer was applied by plasma deposition according to the protocol of Preparative Example 4.

Comparative Example 3

A laminated structure similar to Example 3 was prepared, except that the layer-by-layer structures were not deposited on the inorganic oxide layer. Both Example 3 and Comparative Example 3 were aged both at the 85° C. protocol and at the 65° C. and 95% RH protocol, each for 500 hours. The Comparative Example 3 developed numerous dark "dark dot" defects compared to Example 3, which is substantially free of dark spots.

EMBODIMENTS

Various embodiments of the invention have been described. These and other embodiments are within the scope of the following claims.

1. A barrier film comprising:
   a substrate;
   an inorganic layer disposed on a side of the substrate; and
   an organic layer-by-layer structure disposed on a side of the inorganic layer, wherein the organic layer-by-layer structure comprises a layer of a cationic polyelectrolyte and a layer of an anionic polyelectrolyte.
2. The barrier film of embodiment 1, further comprising a planarization layer disposed on a side of the substrate.
3. The barrier film of any one of embodiments 1 to 2, wherein the substrate comprises a polymeric film.
4. The barrier film of embodiment 3, wherein the polymeric film is selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers.
5. The barrier film of any one of embodiments 1 to 4, wherein the inorganic layer comprises a metal, a metallic compound, a composite material of a metal and an organic material, a composite material of a metallic compound and an organic material, or a combination thereof.
6. The barrier film of embodiment 5, wherein the inorganic layer comprises an inorganic material selected from at least one of aluminum oxide, silicon oxide, aluminum-silicon-oxide, aluminum-silicon-nitride, silicon-oxy-nitride, and aluminum-silicon-oxy-nitride, CuO, $TiO_2$, ITO, $Si_3N_4$, TiN, ZnO, aluminum zinc oxide, $ZrO_2$, yttria-stabilized zirconia and $Ca_2SiO_4$.
7. The barrier film of any one of embodiments 1 to 6, wherein the inorganic layer has pinholes.
8. The barrier film of any one of embodiments 1 to 7, wherein the organic layer-by-layer structure is conformal to the inorganic layer.

9. The barrier film of any one of embodiments 1 to 8, wherein the barrier film is substantially free of nanoparticles or clay.

10. The barrier film of any one of embodiments 1 to 9, wherein the inorganic layer disposed on the substrate has a water vapor transmission rate of less than 0.17 g/m$^2$/day measured at 50° C. and 100% relative humidity and an oxygen transmission rate of less than 0.01 measured at 23° C. and 50% relative humidity.

11. The barrier film of any one of embodiments 1 to 10, wherein the cationic polyelectrolyte comprises polyethylenimines (branched and/or linear), poly(allyl amine), poly (vinyl amine), cationic polyacrylamide, polymelamine, and copolymers thereof and polyvinylpyrrolidone and copolymers or derivatives thereof, and combinations thereof.

12. The barrier film of any one of embodiments 1 to 11, wherein the anionic polyelectrolyte comprises poly(acrylic acid), poly (methacrylic acid), poly (ethacrylic acid), poly (styrene sulfonic acid), poly (maleic acid), poly (vinyl phosphonic acid), and copolymers or derivatives thereof, and combinations thereof.

13. The barrier film of any one of embodiments 1 to 12, wherein the organic layer-by-layer structure comprises alternating layers of a cationic polyelectrolyte and a layer of an anionic polyelectrolyte.

14. The barrier film of any one of embodiments 1 to 13, wherein the barrier film is substantially free of dark spots.

15. A device, comprising
a barrier film of any one of embodiments 1 to 14; and
a luminescent layer.

16. A device, comprising
a first and a second barrier layer, each comprising the barrier film of any one of embodiments 1 to 14; and
a luminescent layer comprising a polymer matrix disposed between the first and the second barrier layers.

17. A method, comprising
(a) depositing a layer of inorganic material on a substrate;
(b) depositing a layer of cationic polyelectrolyte onto the layer of inorganic material from an aqueous solution;
(c) rinsing and/or drying the layer of cationic polyelectrolyte;
(d) depositing a layer of anionic polyelectrolyte onto the layer of cationic polyelectrolyte from an aqueous solution;
(e) rinsing and/or drying the layer of anionic polyelectrolyte; and
(f) repeating the steps of (b)-(e) until a layer-by-layer structure of alternating cationic polyelectrolyte and anionic polyelectrolyte layers is formed.

18. The method of embodiment 17, wherein the layer of inorganic material is deposited by one or more methods selected from the group consisting of condensation, chemical vapor deposition, atomic layer deposition, physical vapor deposition, evaporation, plasma deposition, reactive ion etching, and sputtering.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A barrier film comprising:
a substrate;
an inorganic barrier layer disposed on a side of the substrate, wherein the inorganic layer comprises a metal, a metallic compound, a composite material of a metal and an organic material, a composite material of a metallic compound and an organic material, or a combination thereof, and has a water vapor transmission rate of less than 0.17 g/m$^2$/day measured at 50° C. and 100% relative humidity and an oxygen transmission rate of less than 0.01 measured at 23° C. and 50% relative humidity; and
an organic layer-by-layer structure disposed on a side of the inorganic layer, wherein the organic layer-by-layer structure comprises a layer of a cationic polyelectrolyte and a layer of an anionic polyelectrolyte.

2. The barrier film of claim 1, further comprising a planarization layer disposed on a side of the substrate.

3. The barrier film of claim 1, wherein the substrate comprises a polymeric film.

4. The barrier film of claim 3, wherein the polymeric film is selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers.

5. The barrier film of claim 1, wherein the inorganic layer comprises an inorganic material selected from at least one of aluminum oxide, silicon oxide, aluminum-silicon-oxide, aluminum-silicon-nitride, silicon-oxy-nitride, and aluminum-silicon-oxy-nitride, CuO, TiO$_2$, ITO, Si$_3$N$_4$, TiN, ZnO, aluminum zinc oxide, ZrO$_2$, yttria-stabilized zirconia and Ca$_2$SiO$_4$.

6. The barrier film of claim 1, wherein the inorganic layer has pinholes.

7. The barrier film of claim 1, wherein the organic layer-by-layer structure is conformal to the inorganic layer.

8. The barrier film of claim 1, wherein the barrier film is substantially free of nanoparticles or clay.

9. The barrier film of claim 1, wherein the cationic polyelectrolyte comprises polyethylenimines (branched and/or linear), poly(allyl amine), poly(vinyl amine), cationic polyacrylamide, polymelamine, and copolymers thereof and polyvinylpyrrolidone and copolymers or derivatives thereof, and combinations thereof.

10. The barrier film of claim 1, wherein the anionic polyelectrolyte comprises poly(acrylic acid), poly (methacrylic acid), poly (ethacrylic acid), poly (styrene sulfonic acid), poly (maleic acid), poly (vinyl phosphonic acid), and copolymers or derivatives thereof, and combinations thereof.

11. A device, comprising
a barrier film of claim 1; and
a luminescent layer.

* * * * *